United States Patent
Lee et al.

(10) Patent No.: US 7,276,298 B2
(45) Date of Patent: Oct. 2, 2007

(54) SUBSTANCE FOR INTERMEDIATE LAYER OF ORGANIC ELECTROLUMINESCENT DEVICE AND ORGANIC ELECTROLUMINESCENT DEVICE USING THE SAME

(75) Inventors: Soo-hyoung Lee, Suwon-si (KR); Yi-yeol Lyu, Daejeon-si (KR); Eun-kyung Lee, Seoul (KR); Tae-yong Noh, Gunpo-si (KR)

(73) Assignee: Samsung SDI Co., Ltd., Suwon (KR)

( * ) Notice: Subject to any disclaimer, the term of this patent is extended or adjusted under 35 U.S.C. 154(b) by 305 days.

(21) Appl. No.: 10/998,821

(22) Filed: Nov. 30, 2004

(65) Prior Publication Data
US 2005/0136288 A1    Jun. 23, 2005

(30) Foreign Application Priority Data
Dec. 23, 2003    (KR) ............................ 2003-0095527

(51) Int. Cl.
H01L 51/54    (2006.01)
C09K 11/06    (2006.01)
H05B 33/12    (2006.01)

(52) U.S. Cl. ...................... 428/690; 428/917; 313/504; 313/506; 257/40; 546/101; 544/101; 564/305; 548/440

(58) Field of Classification Search ................ 428/690, 428/917; 257/E57.049, 40; 313/504, 506; 546/101; 544/101; 564/305; 548/440
See application file for complete search history.

(56) References Cited

U.S. PATENT DOCUMENTS

| | | | |
|---|---|---|---|
| 4,323,756 A | 4/1982 | Brown et al. |
| 4,863,538 A | 9/1989 | Deckard |
| 4,927,992 A | 5/1990 | Whitlow et al. |
| 5,038,014 A | 8/1991 | Pratt et al. |
| 5,433,280 A | 7/1995 | Smith |
| 5,544,550 A | 8/1996 | Smith |
| 5,578,227 A | 11/1996 | Rabinovich |

(Continued)

OTHER PUBLICATIONS

Brice, C.A., Henn, D.S. et al, "Rapid Prototyping and Freeform Fabrication via Electron Beam Welding Deposition", 2002 Internationals Institute of Welding Annual Assembly, Copenhagen Denmark, Jun. 26, 2002.

(Continued)

Primary Examiner—Rena Dye
Assistant Examiner—Camie Thompson
(74) Attorney, Agent, or Firm—H.C. Park & Associates, PLC (57) ABSTRACT

The present invention is related to an intermediate layer of an organic electroluminescent device comprising an amine derivative substance which may further comprise a functional group capable of forming crosslinks. In particular, the substance may have excellent solubility and can be easily formed into a thin film. Specifically, the thin film may be stable in the solvent and can be easily formed to various thicknesses. Furthermore, the band gaps and LUMO/HOMO values may be easily controlled depending of the characteristics of the hole transporting material, so that an intermediate layer with the desired characteristics may be formed. Accordingly, the introduction of an intermediate layer manufactured using the substance of the present invention as the intermediate layer may result in an organic electroluminescent device having high efficiency and a longer lifespan.

13 Claims, 5 Drawing Sheets

U.S. PATENT DOCUMENTS

| | | |
|---|---|---|
| 5,839,329 A | 11/1998 | Smith et al. |
| 5,957,006 A | 9/1999 | Smith |
| 6,268,584 B1 | 7/2001 | Keicher et al. |
| 6,391,251 B1 | 5/2002 | Keicher et al. |
| 6,410,105 B1 | 6/2002 | Mazumder et al. |
| 6,429,402 B1 | 8/2002 | Dixon et al. |
| 6,476,343 B2 | 11/2002 | Keicher et al. |
| 6,605,795 B1 | 8/2003 | Arcella et al. |
| 6,656,409 B1 | 12/2003 | Keicher et al. |
| 6,696,664 B2 | 2/2004 | Pyritz et al. |
| 2003/0094259 A1 | 5/2003 | Siedal |
| 2003/0206820 A1 | 11/2003 | Keicher et al. |
| 2005/0158579 A1* | 7/2005 | Marks et al. ............... 428/690 |

OTHER PUBLICATIONS

Taminger, Karen, Hafley, Robert, "Characterization of 2219 Aluminum Produced by Electron Beam Freeform Fabrication" 13th Solid Freeform Fabrication Symposium, San Antonio, TX Aug. 5-7, 2002.

Ernz, Mark T., Griffith, Michelle L., Reckaway, Daryl E., "Critical Issues for Functionally Graded Material Deposition by Laser Engineered Net Shape" Sandia National Laboratories, Albuquerque, NM, undated.

* cited by examiner

SUBSTANCE FOR INTERMEDIATE LAYER OF ORGANIC ELECTROLUMINESCENT DEVICE AND ORGANIC ELECTROLUMINESCENT DEVICE USING THE SAME

CROSS-REFERENCE TO RELATED APPLICATIONS

This application claims priority to Korean Patent Application No. 2003-95527, filed on Dec. 23, 2003, in the Korean Intellectual Property Office, the disclosure of which is incorporated herein in its entirety by reference.

FIELD OF THE INVENTION

The present invention is related to an organic electroluminescent device. In particular, the present invention is related to a substance having hole transporting capability and may be formed to a thin film having a stable structure. An organic electroluminescent device comprising an intermediate layer comprising the substance of the present invention may be interposed between a hole transporting layer and an electroluminescent layer thereby achieving a higher efficiency and a longer lifespan.

BACKGROUND

Organic electroluminescent devices can be classified into low molecular weight organic electroluminescent devices and polymer organic electroluminescent devices depending on the materials and manufacturing process used to produce the organic electroluminescent device. Low molecular weight molecules can be easily synthesized and emissive compounds for red, green and blue light, which are the three primary colors of a visible range, can be synthesized by obtaining the proper molecular structures.

There are advantages to manufacturing low molecular weight organic electroluminescent devices. Since thin films may be formed by vacuum deposition, emissive materials may be easily refined and purified to a higher degree and color pixels may more easily be achieved. In order to apply the low molecular weight organic electroluminescent devices to practical applications, however, an improvement in quantum efficiency and color purity is needed and the crystallization of thin films must be prevented. Low molecular weight electroluminescent devices are now commercially applied to small-sized panels for mobile communication and car radios.

Research on polymer electroluminescent devices has accelerated since the discovery of the ability of poly(1,4-phenylene vinylene) (PPV), a π-conjugated polymer, to emit light when exposed to electricity. π-conjugated polymers have an alternating structure of single bonds (σ-bonds) and double bonds (π-bonds), where π-electrons are evenly distributed and free to move in the polymer chain. With proper molecular designing, π-conjugated polymers may have semiconducting properties and may emit light in a visible range corresponding to the HOMO (highest occupied molecular orbital)-LUMO (lowest unoccupied molecular orbital) energy bandgap when included in an electroluminescent layer of an electroluminescent device. Furthermore, such a polymer can easily be formed into a thin layer in electroluminescent devices by spin coating or printing at low manufacturing costs. In addition, π-conjugated polymers have high glass transition temperatures, so that a thin layer having excellent mechanical properties can be obtained. Accordingly, π-conjugated polymer organic electroluminescent devices are expected to have a commercial competitive edge over low molecular weight electroluminescent devices.

Such π-conjugated polymer electroluminescent devices, however, have lower emissive luminance than low molecular weight electroluminescent devices and exhibit poor durability due to deterioration of the emissive polymer. During synthesis of such polymer materials, defects may be generated, resulting in the deterioration of molecular chains. Moreover, it is difficult to refine the synthesized polymer to a high degree. Developing a polymerizing technique that minimizes defects generated in the π-conjugated polymers may overcome these problems, as well as by developing a refining technique that can remove impurities existing in the π-conjugated polymers. If π-conjugated polymer materials synthesized in the above-described manner are continuously fed back to improve the performance of an organic electroluminescent device, an organic electroluminescent device with superior performance can be accomplished.

In addition, when the π-conjugated polymer material is used to manufacture a multi-layered thin film having various functions, which is usually formed using a low molecular weight molecule, stability of thin films, in particular, uniformity of the thin films is lower than when using a low molecular weight molecule, and also only limited solvents can be used. As a result, thin films cannot be easily formed using π-conjugated polymer material. Many efforts to solve these problems have been made. For example, like a low molecular weight electroluminescent device, a π-conjugated polymer electroluminescent device with high efficiency and a long lifetime can be obtained by using a multilayer system including, e.g., a buffer layer, a hole transporting layer, an electron transporting layer, and a hole blocking layer.

Many efforts have focused on manufacturing a stable multilayer thin film providing various functions. For example, the introduction of an intermediate layer after forming a hole transporting layer thin film and before depositing an electroluminescent layer on the intermediate layer, thereby obtaining high emission efficiency and a long lifetime has been proposed. Here, the introduction of the intermediate layer minimizes quenching of excitons and degradation of an electroluminescent layer. The quenching occurs when excess electrons, which result from unbalanced holes and electrons, combine with holes to form excitons which travel to the hole transporting layer.

Figure 1:
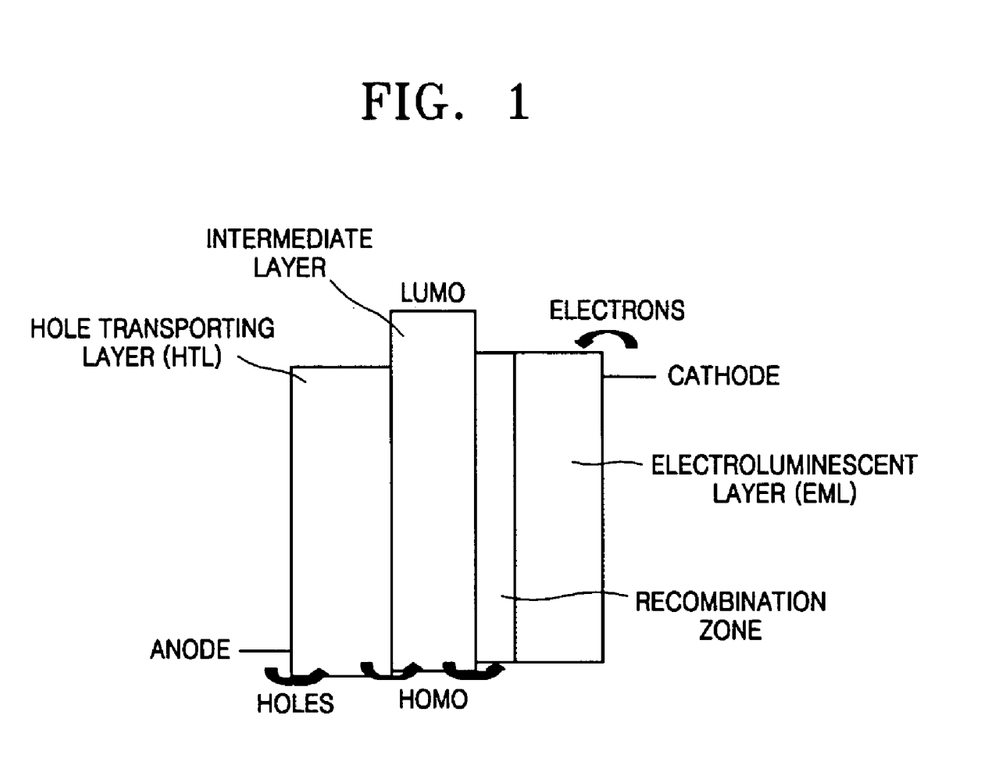
FIG. 1 illustrates an intermediate layer in a conventional organic electroluminescent device.

Referring to FIG. 1, an intermediate layer having a larger band gap than the hole transporting layer and an electroluminescent layer including a hole transporting material within its structure is shown. In this case, the device has a properly controlled HOMO value. As a result, holes can travel into the emissive layer without experiencing a barrier. However, since the LUMO value is small, the intermediate layer functions as a barrier when excess electrons and excitons travel into the hole transporting layer. Indeed, the electrons and excitons carried to the hole transporting layer can be minimized, so that a recombination zone, where excitons are generated, exists only within the emissive layer. Therefore, an organic electroluminescent device with a higher efficiency and a longer lifetime can be manufactured.

Alternatively, depending on what substance was used to fabricate the intermediate layer, red, green, and blue luminescent devices will exhibit different characteristics from one another. In particular, a blue luminescent device having an intermediate layer exhibits enhanced efficiency, which can be more than two times the efficiency of an intermediate layer-free blue luminescent device. Moreover, the blue luminescent device may last for 10,000 hours or longer as disclosed in U.S. Pat. No. 5,858,562.

Since the intermediate layer is soluble in certain solvents, however, suitable solvents that may be used to the electroluminescent layer may be limited. As a result, the thickness of the thin films may not be easily controlled. Furthermore, in order to adjust the band gap of the intermediate layer and the LUMO/HOMO value according to the electroluminescent layer used, optimization of the structure of the polymer chains may be required. However, synthesis of the polymer is not easily performed and there is a limit to the adjustment.

SUMMARY OF THE INVENTION

The present invention may be directed to an organic electroluminescent device having a higher efficiency and better lifetime characteristics. Specifically, the present invention may be directed to a layer of an electroluminescent device comprising a substance which may have a molecular structure capable of controlling the bandgap, and where the LUMO and HOMO values may be easily obtained. In a particular aspect, the substance may compensate for the defects of a common intermediate layer interposed between a hole transporting layer and an electroluminescent layer. A thin film comprising the substance may be stable in a solvent, may have a high uniformity, and may be easily formed to a desired thickness.

In one aspect of the present invention, an intermediate layer of an organic electroluminescent device may comprises a substance represented by Formula 1, as illustrated below:

Formula 1 where A may be an amine derivative moiety having a hole transporting capability, where the amine derivative moiety may be a 2-valent moiety, a 3-valent moiety, or a 4-valent moiety; each of $Y_1$, $Y_2$, $Y_3$, and $Y_4$ may independently be a group having a functional group capable of crosslinking; and each of a and b may independently be 0 or 1, where if A is a 2-valent moiety, both a and b may be 0 and if A is a 4-valent moiety, both a and b may be 1.

The present invention may also provide an organic electroluminescent device comprising an organic layer interposed between a pair of electrodes. In addition, the organic layer may comprise the substance represented by Formula 1 as the intermediate layer or a product resulting from a cross-linking reaction.

DETAILED DESCRIPTION OF THE INVENTION

The present invention is directed to an intermediate layer of an organic electroluminescent device which comprises a substance represented by Formula 1, as illustrated below.

Formula 1 where A may be an amine derivative moiety having a hole transporting capability, where the amine derivative moiety may be a 2-valent moiety, a 3-valent moiety, or a 4-valent moiety; where each of $Y_1$, $Y_2$, $Y_3$, and $Y_4$ may independently be a group having a functional group capable of crosslinking; and each of a and b, may independently be 0 or 1, where if A is a 2-valent moiety, both a and b may be 0 and if A is a 4-valent moiety, both a and b may be 1. In one embodiment of the present invention, a thin film may be easily formed from the substance, which comprises a functional group that facilitates a chemically induced cross-linkage.

In Formula 1, A may be one of the amine derivatives represented by Formula 2, below, and may have a hole transporting capability.

Formula 2 where X may be, for example, a single bond —$(CH_2)_n$— where n may be 1 or 2, —$C(R_1)(R_2)$—, —CH=CH—, —S—, —O—, or —$Si(R_1)(R_2)$— where each of $R_1$ and $R_2$ may independently be a substituted or unsubstituted $C_{1-12}$ linear or branched alkyl group, a substituted or unsubstituted $C_{3-12}$ cycloalkyl group, a substituted or unsubstituted $C_{5-14}$ aryl group, or a substituted or unsubstituted $C_{2-14}$ heteroaryl group. In addition, each of $Ar_1$, $Ar_2$, $Ar_3$ and $Ar_4$ may independently be a substituted or unsubstituted $C_{1-12}$ linear or branched alkylene group, a substituted or unsubstituted $C_{3-12}$ cycloalkylene group, a substituted or unsubstituted $C_{5-14}$ arylene group, or a substituted or unsubstituted $C_{2-14}$ heteroarylene group, for example. Moreover, B may be a compound, such as a hydrogen atom, a $C_{1-12}$ linear or branched alkyl group, a $C_{3-12}$ cycloalkyl group, a substituted or unsubstituted $C_{5-14}$ aryl group, or a substituted or unsubstituted $C_{2-14}$ hetroaryl group.

In a particular embodiment, the amine derivatives represented by Formula 2 may be a group represented by Formula 6, illustrated below:

Formula 6 where each of R, R', R", R'", and R"" may be a one-substituted or multi-substituted functional group and may be independently a hydrogen atom, a substituted or unsubstituted $C_{1-12}$ linear or branched alkyl group, a substituted or unsubstituted $C_{3-12}$ cycloalkyl group, a substituted or unsubstituted $C_{5-14}$ aryl group, or a substituted or unsubstituted $C_{2-14}$ heteroaryl group, for example.

In Formula 1 according to an embodiment of the present invention, each of $Y_1$, $Y_2$, $Y_3$, and $Y_4$ may independently be a hydrogen or any compound such as the compounds represented by Formula 3:

Formula 3 where $R_1$ may be a substituted or unsubstituted $C_{1-12}$ linear or branched alkylene group, a substituted or unsubstituted $C_{3-12}$ cycloalkylene group, a substituted or unsubstituted $C_{6-14}$ arylene group, a substituted or unsubstituted $C_{2-14}$ hetroarylene group, —O—C(=O)—(CH$_2$)$_n$—, or —(CH$_2$)$_n$—O— where n may be an integer in the range of about 1 to about 12. Additionally, each of $R_2$, $R_3$, and $R_4$ may independently be, for example, H, Cl, —OH, a $C_{1-12}$ alkyl group, a $C_{1-12}$ alkoxy group, a $C_{1-12}$ hydroxyalkyl group, a $C_{6-14}$ aryl group, or a $C_{2-14}$ heteroaryl group. Furthermore, $R_5$ may be H, a $C_{1-12}$ alkyl group, a $C_{1-12}$ alkoxy group, a $C_{6-14}$ aryl group, or a $C_{2-14}$ heteroaryl group, for example.

In another embodiment, in Formulas 1-3, described above, the substituent may be a halogen atom such as F, —Si($R_1$)($R_2$)($R_3$), a $C_{1-12}$ alkoxy group, —N($R_1$)($R_2$)($R_3$), where each of $R_1$, $R_2$, and $R_3$ may independently be H, a $C_{1-12}$ alkyl group, and a $C_{1-12}$ alkoxy group, for example.

The substance for the intermediate layer represented by Formula 1 may comprise an amine derivative A, which may be a hole transporting material, in its backbone, and may employ one or more of the compounds represented by Formula 3. The compounds represented by Formula 3 may be cross-linked. As a result, the substance may have high solubility, enhanced thin film forming capacity, and excellent stability in a solvent after forming the thin film. Moreover, thin films with varying thicknesses may be easily formed. In particular, according to properties of the amine derivative A, various band gaps and LUMO/HOMO values may be easily controlled, thus providing the desired characteristics to the intermediate layer. Ultimately, an organic electroluminescent device with high efficiency and a long lifetime may be achieved by using the substance for the intermediate layer.

In another embodiment of the present invention, the substance for the intermediate layer of an organic electroluminescent device of the present invention may comprise a compound represented by Formula 4 or Formula 5, as illustrated below.

Formula 4

Formula 5

In an organic electroluminescent device of the present invention, the intermediate layer may be formed between a hole transporting layer and an electroluminescent layer using the substance. The organic electroluminescent device may have a structure comprising, but is not limited to, an anode/hole transporting layer/intermediate layer/emissive layer/cathode structure, an anode/buffer layer/hole transporting layer/intermediate layer/emissive layer/cathode structure, an anode/buffer layer/hole transporting layer/intermediate layer/emissive layer/electron transporting layer/cathode structure, or an anode/buffer layer/hole transporting layer/intermediate layer/emissive layer/hole blocking layer/cathode structure. An organic electroluminescent device according to the present invention may be manufactured using any methodology known by those skilled in the art.

Figure 2:
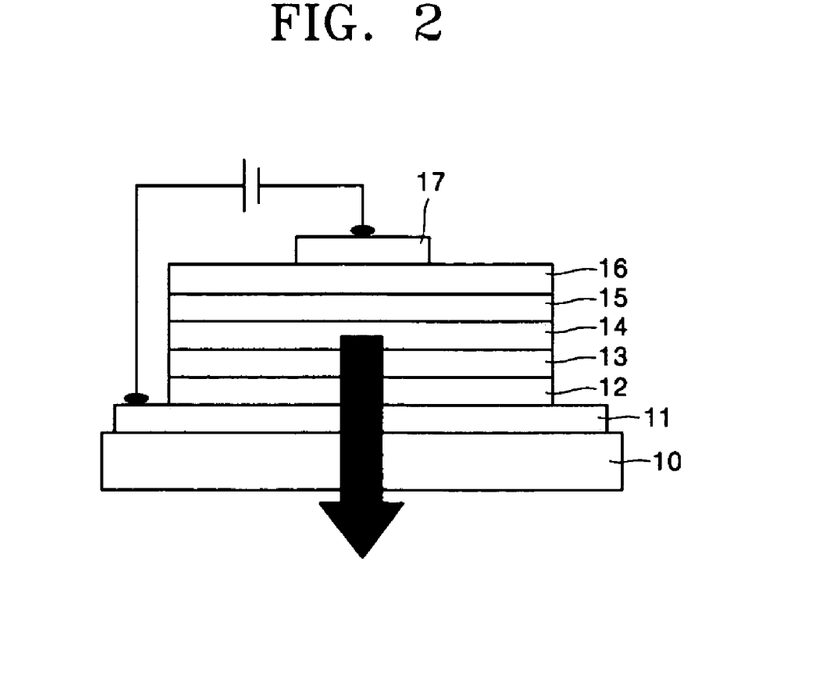
FIG. 2 illustrates a sectional view of an organic electroluminescent device according to an embodiment of the present invention.

Turning to FIG. 2, which illustrates an embodiment of the present invention, a sectional view of an organic electroluminescent device is shown. Referring to FIG. 2, a substrate 10 may first be coated with an anode electrode material to form an anode 11. The substrate may be a substrate used in a conventional organic electroluminescent device. In particular, the substrate may be, for example, a glass substrate that is transparent and waterproof, has a surface smooth, and can be easily treated; or a transparent plastic substrate comprised of a soft material such as polyethylenetelephthalate (PET), polycarbonate, or polyimide. An anode electrode material may be a transparent material having good conductivity, such as ITO (Indium Tin Oxide), IZO (Indium Zinc Oxide), $SnO_2$, ZnO, or any combination thereof.

A hole transporting material may be vacuum deposited or spin-coated to form a hole transporting layer (HTL) 12 on the anode 11. After the hole transporting material is spin-coated, it may be baked at a temperature that may vary depending on the type of material used to fabricate the hole transporting layer 12. The hole transporting layer 12 may be composed of any material commonly used in the field. For example, the substance for forming the hole transporting layer 12 may be polytriphenylamine.

A buffer layer (not shown) may be selectively formed between the anode 11 and the hole transporting layer 12. The buffer layer may be composed of any material commonly used in the field. For example, the buffer layer may be composed of copper phthalocyanine (CuPc), m-MTDATA, polythiophene, polyaniline, polyacetylene, polypyrrole, polyphenylene vinylene, or any derivatives thereof. An intermediate forming composition may then be spin-coated and then heated or exposed to light to induce a cross-linking reaction, thereby forming an intermediate layer 13 on the hole transporting layer 12. The intermediate layer 13 may have a thickness in the range of about 10 nm to about 30 nm. The light may be UV light.

The intermediate forming composition may comprise the substance represented by Formula 1 and a solvent. Examples of the solvent may include cyclohexanon, toluene, xylene, and the like. The solvent and the substance for an intermediate layer may be present in a weight ratio in the range of about 100:1 to about 100:2.

An electroluminescent layer (EML) 14 maybe formed on the intermediate layer 13. The emissive layer 14 may be composed of, but is not limited to, a polyfluorene or a polyparaphenylene. A method of forming the emissive layer 14 may vary depending upon the type of material used to fabricate the emissive layer 14. For example, the emissive layer 14 may be formed by vacuum deposition.

A hole blocking layer (HBL) 15 may be selectively formed by deposition on the emissive layer 14. The hole blocking layer 15 may be composed of any material commonly used in the field. For example, the hole blocking layer 15 may be composed of LiF, $BaF_2$, $MgF_2$, or the like.

An electron transporting layer (ETL) 16 may then be formed on the hole blocking layer 15. The electron transporting layer 15 may be composed of any material commonly used in the field. For example, the electron transporting layer 15 may be composed of polyoxadiazole.

A cathode 17 may be formed on the electron transporting layer 16 by vacuum-depositing a metal for the cathode, thereby completing the organic electroluminescent device. The electron transporting layer may be composed of a any metal such as Li, Mg, Al, Al—Li, Ca, Mg—In, Mg—Ag, or the like.

EXAMPLES

Specific Example 1

Synthesis of the Compound Represented by Formula 4

Figure 3:
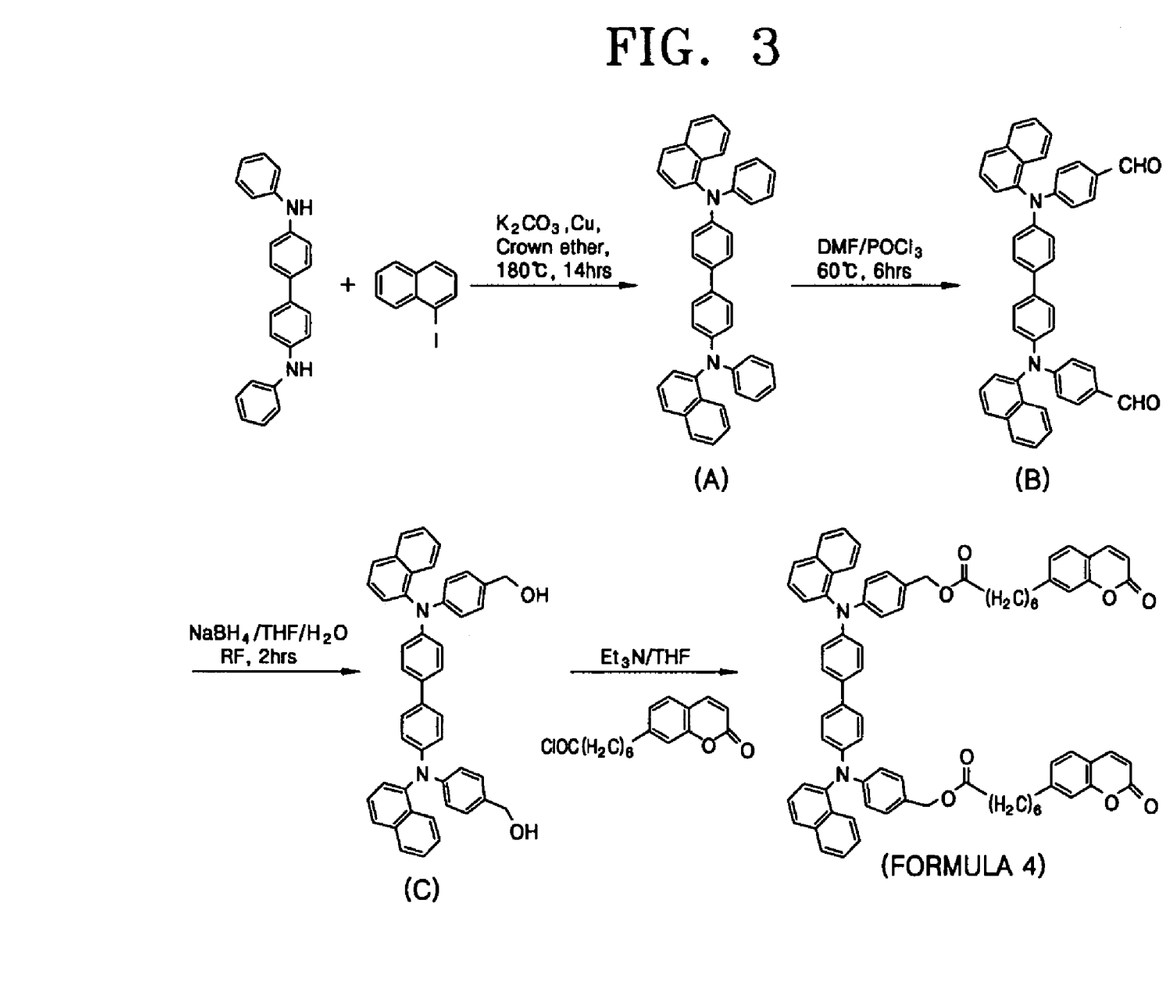
FIG. 3 depicts a chemical diagram illustrating the synthesis scheme for the compound of Formula 4 as prepared in Example 1.
Figure 4:
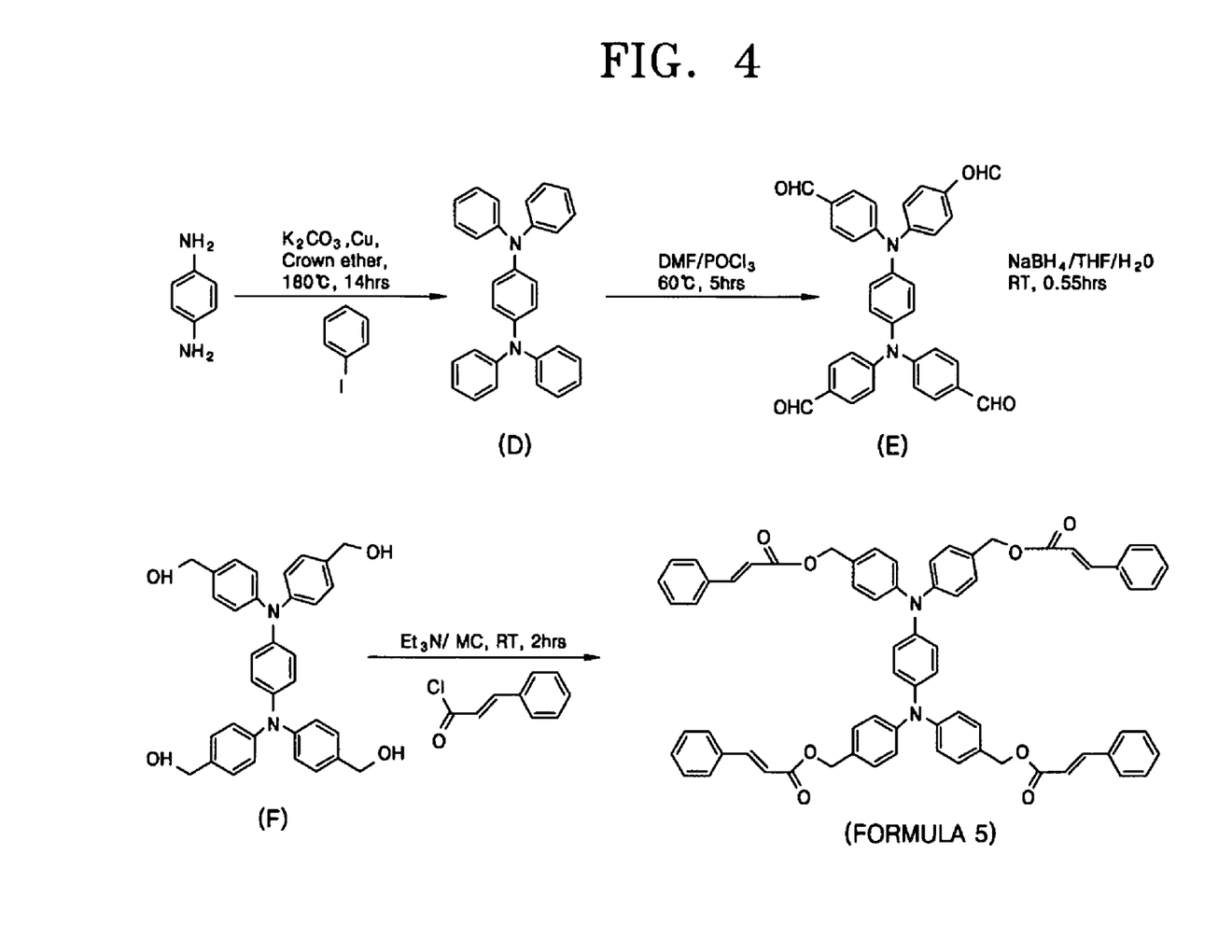
FIG. 4 depicts a chemical diagram illustrating the synthesis scheme for the compound of Formula 5 as prepared in Example 2.

FIGS. 3 and 4 illustrate exemplary methods of manufacturing the blue electroluminescent compounds described in Examples 1 and 2, as follows.

Preparation of Compound (A)

14 g (218.8 mmol) of copper, 30 g (217.1 mmol) of $K_2CO_3$, and 200 mg of 18-crown ether-6 were added to a solution containing 7 g (20.8 mmol) of N'-diphenylbenzidine and 22.25 g (87.6 mmol) of 4-iodonaphthalene dissolved in 100 ml of 2-dichlorobenzene. The mixture was heated to a temperature in the range of about 180° C. to about 190° C. and reacted for about 14 hours. After the reaction was completed, the reaction mixture was filtered to remove the inorganic salt. The resultant reaction mixture was concentrated, and subjected to silica gel column chromatography using n-hexane as an eluent. 8.2 g of a resulting product was yielded. The structure of the resultant product was characterized using $^1$H-NMR spectroscopy.

Preparation of Compound (B)

After 2.63 ml (33.98 mmol) of DMF was cooled using ice, 3.167 ml (33.98 mmol) of $POCl_3$ was slowly added, followed by addition of a solution of 10 g (16.99 mmol) of Compound (A) dissolved in 60 ml of 1,2-dichloroethane. The mixture was reacted for about 5 hours at a temperature of about 60° C. The reaction mixture was cooled, added to water, extracted using ethylacetate, and concentrated. The concentrated reaction mixture was subjected to silica gel column chromatography using a 8:1 mixture of n-hexane and ethylacetate by volume as an eluent. 6 g of a resultant product was yielded. The structure of the resultant product was identified through $^1$H-NMR spectroscopy.

Preparation of Compound (C)

A solution of 3.94 g (104 mmol) of $NaBH_4$ dissolved in 5 ml of water was added to a solution of 6 g (9.3 mmol) of Compound (B) dissolved in 100 ml of THF at room temperature. The mixture was reacted at room temperature for about 2 hours. After the reaction was completed, water was added. The reaction mixture was extracted using ethylacetate, concentrated, and subjected to silica gel column chromatography using a 1:1 mixture of n-hexane and ethylacetate by volume as an eluent. 5.7 g of a resultant product was yielded. The structure of the resultant product was identified through $^1$H-NMR spectroscopy.

Manufacture of the Compound Represented by Formula 4

1 g (0.0015 mol) of Compound (C) was dissolved in 10 ml of THF under a nitrogen atmosphere. The reaction mixture was cooled to a temperature of 0° C. Then, 0.59 g (0.005 mol) of triethylamine was added to the cooled reaction mixture, and stirred for one hour. 1.56 g (0.0036 mol) of coumarin-oxyhexyl chloride was added to the reaction mixture at 0° C. and then heated to room temperature. The resultant reaction mixture was stirred for one day. The stirred reaction mixture was extracted using ether, dried using $MgSO_4$, and filtered to remove a solvent. The resultant solid was refined using column chromatography to obtain the purified compound represented by Formula 4. The structure of the compound was identified through 1H-NMR spectroscopy.

Specific Example 2

Synthesis of the Compound Represented by Formula 5

Preparation of Compound (D)

14 g (218.8 mmol) of copper, 30 g (217.1 mmol) of $K_2CO_3$, and 200 mg of 18-crown ether-6 were added at room temperature to a solution of 12.5 g (48 mmol) of N'-diphenyl-1,4-phenylenediamine and 16.1 ml (144 mmol) of 4-iodobenzene dissolved in 180 ml of 2-dichlorobenzene. The reaction mixture was heated to a temperature in the range of about 180° C. to about 190° C. and reacted for about 14 hours. After the reaction was completed, the reaction mixture was filtered to remove an inorganic salt. The resultant reaction mixture was concentrated, and subjected to silica gel column chromatography using n-hexane as an eluent. 1.24 g of a resultant product was yielded. The structure of the resultant product was identified through $^1$H-NMR spectroscopy.

Preparation of Compound (E)

After 2.63 ml (33.98 mmol) of DMF was cooled on ice, 3.167 ml (33.98 mmol) of $POCl_3$ was slowly added, followed by the addition of a solution of 1.24 g (3 mmol) of Compound (D) dissolved in 10 ml of 1,2-dichloroethane. The mixture was reacted for 6 hours at a temperature of 60° C. The reaction mixture was cooled, added to water, extracted using ethylacetate, and concentrated. The concentrated reaction mixture was subjected to silica gel column chromatography using an 8:1 mixture of n-hexane and ethylacetate by volume as an eluent. 0.093 g of a resultant product was yielded. The structure of the resultant product was identified through $^1$H-NMR spectroscopy.

Preparation of Compound (F)

A solution of 0.128 g (3.39 mmol) of $NaBH_4$ dissolved in 0.08 ml of water was added at room temperature into a solution of 0.093 g (0.178 mmol) of Compound (E) dissolved in 1 ml of THF. The mixture was reacted at room temperature for 30 minutes. After the reaction was completed, water was added. The reaction mixture was extracted using ethylacetate, concentrated, and subjected to silica gel column chromatography using a 1:1 mixture of n-hexane and ethylacetate by volume as an eluent. 0.075 g of a resultant product was yielded. The structure of the resultant product was identified through $^1$H-NMR spectroscopy.

Manufacture of the Compound Represented by Formula 5

0.094 g (0.57 mmol) of cinnamoyl chloride was slowly added to a solution of 0.93 g (0.178 mol) of Compound (F) and 0.099 ml (0.715 mmol) of $Et_3N$ dissolved in methylene chloride. The resultant mixture sat for 2 hours at room temperature and was then added to water. The reaction mixture was extracted using ethylacetate, concentrated, and subjected to silica gel column chromatography using an 8:1 mixture of n-hexane and ethylacetate by volume as an eluent to obtain 0.083 g of a resultant product. The structure of the resultant product was identified through $^1$H-NMR spectroscopy.

Figure 5:
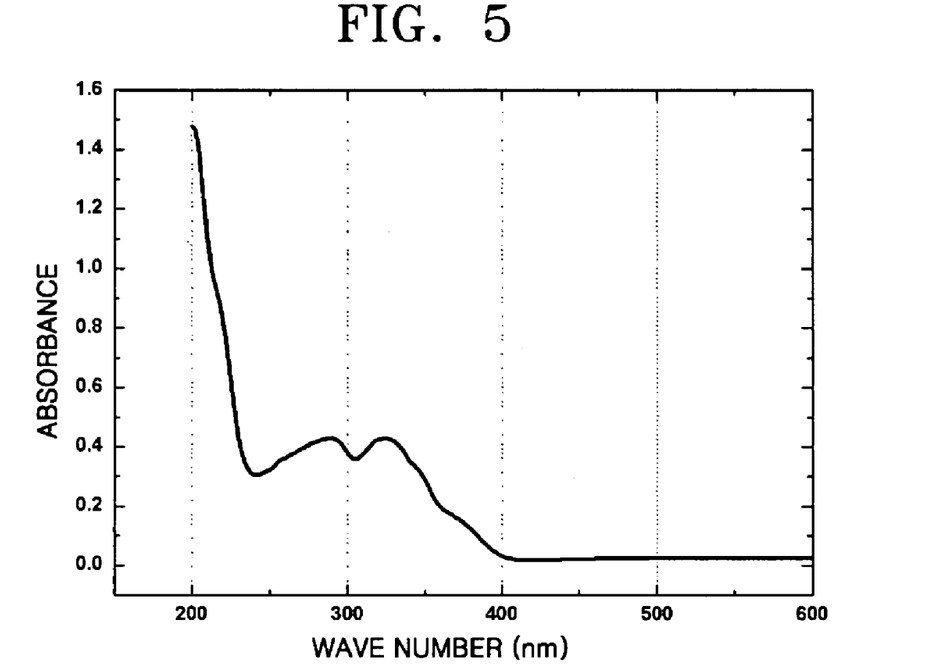
FIG. 5 is a UV-vis spectrum for the compound of Formula 4 as prepared in Example 1.
Figure 6:
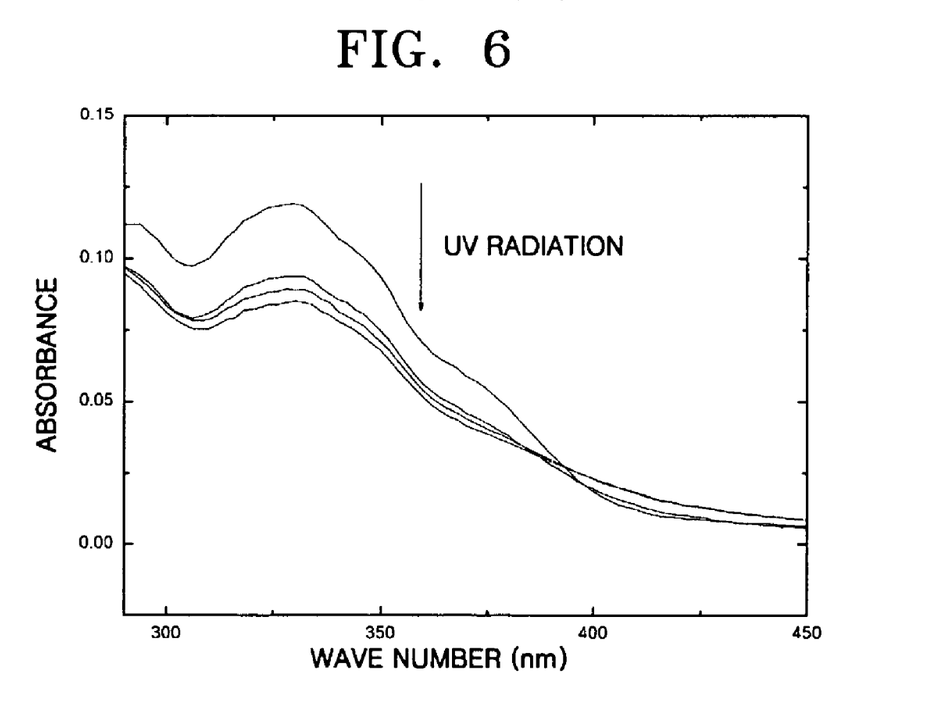
FIG. 6 illustrates the UV-vis spectra absorption with respect to time for the compound of Formula 5 as prepared in Example 2.

The optical characteristics of the compounds represented by Formulas 4 and 5 as prepared in Examples 1 and 2 were measured. A thin film was formed by spin-coating on a quartz substrate using a solution prepared by dissolving in cyclohexanon the compound of Formula 4 as prepared in Example 1. Then, a UV-vis spectrum (FIG. 5) of the thin film was measured. The spectrum of the compound represented by Formula 4 exhibited specific peaks at frequencies of 280 nm and 330 nm. The peaks had appropriately equal heights. In order to confirm whether crosslinking occurred, UV-vis absorption spectra were measured with respect to time by radiating UV onto the prepared thin film (FIG. 6). It was confirmed that the height of the peak at a frequency of 330 nm decreased over time. The decrease in peak height indicates that a light cross-linking component included in the compound represented by Formula 4 reacted with light to bring about the crosslinking reaction. The same test was carried out for the compound represented by Formula 6. As a result, the occurrence of the cross-linking reaction was confirmed.

Specific Example 3

Manufacture of Electroluminescent Device Using the Compound of Formula 5

An organic electroluminescent device was formed using the compound of Formula 5 as prepared in Example 2. First, a glass substrate was coated with indium tin oxide (ITO), and then cleaned to form a transparent electrode substrate. The ITO layer was patterned into a desired shape using a photoresistant resin and etchant, and washed to form an anode. Poly (styrene sulfonate)-doped poly (3,4-ethylenedioxy thiophene) (PEDOT) (Bayer Co., West Haven, Conn.) was coated on the anode to a thickness of about 500 Å and baked at 100° C. for 10 minutes to form the hole transporting layer. Then, the hole transporting layer was spin-coated with a solution of 0.01 parts by weight of the compound of Formula 5 dissolved in 1 part by weight of cyclohexanon, and was then radiated/exposed to UV light to facilitate a crosslinking reaction, thus forming the intermediate layer.

Next, the emissive layer was spin-coated with an electroluminescent layer forming solution of 0.01 parts by weight of polyfluorene dissolved in 1 part by weight of chlorobenzene, baked, and placed in a vacuum oven to fully remove the solvent, thereby forming an electroluminescent layer. The emissive layer forming solution was first filtered using a 0.2 μm filter before the spin-coating process was performed, and the emissive layer was formed to a thickness of 800 Å by controlling the concentration of the solution and the spin speed. Then, calcium and aluminum were sequentially deposited on the emissive layer in a vacuum deposition chamber at a pressure of $4 \times 10^{-6}$ torr to form a cathode. During the deposition, the thickness and the growing speed of layers were controlled using a crystal sensor. An electroluminescent device manufactured in the above-mentioned manner had a single stack structure having an emissive area of 6 $mm^2$.

Specific Example 4

Manufacture of an Electroluminescent Device Using Formula 4

An organic electroluminescent device was manufactured in the same manner as in Example 1, except that an intermediate layer was formed using the compound of Formula 4 instead of the compound of Formula 5.

Specific Example 5

Manufacture of an Electroluminescent Device

An organic electroluminescent device was manufactured in the same manner as in Example 1, except that an intermediate layer was not formed. The organic electroluminescent devices manufactured in Examples 1 and 2 exhibited typical rectifying diode characteristics when a forward bias voltage, which produced a direct current, was used as a turn-on voltage. In addition, efficiency and lifetime properties of the electroluminescent devices manufactured in Example 1 and Example 5 were measured, and the results are shown in FIGS. 7 and 8.

Figure 7:
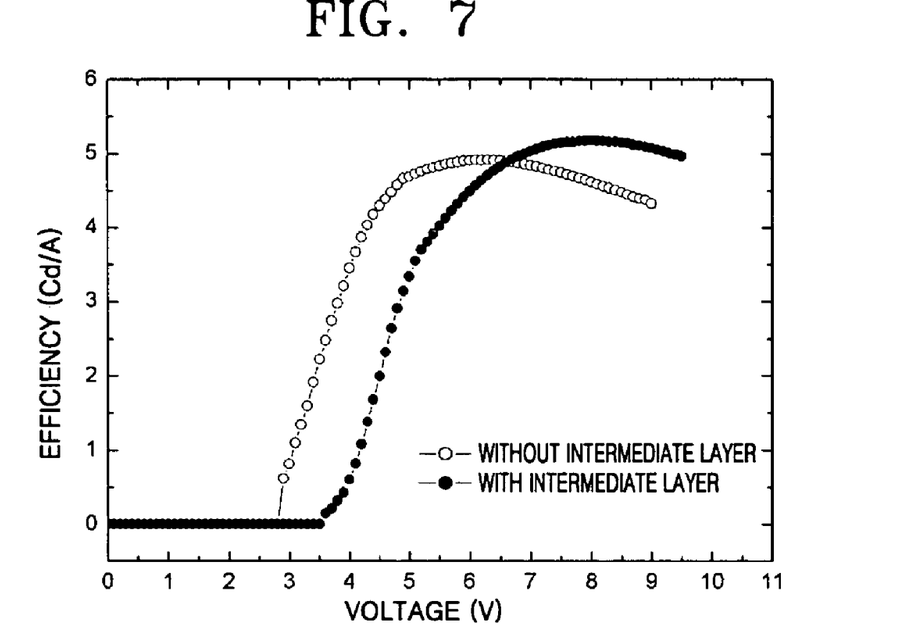
FIG. 7 illustrates a graph for voltage versus efficiency of organic electroluminescent devices manufactured in Example 3 and Example 5.
Figure 8:
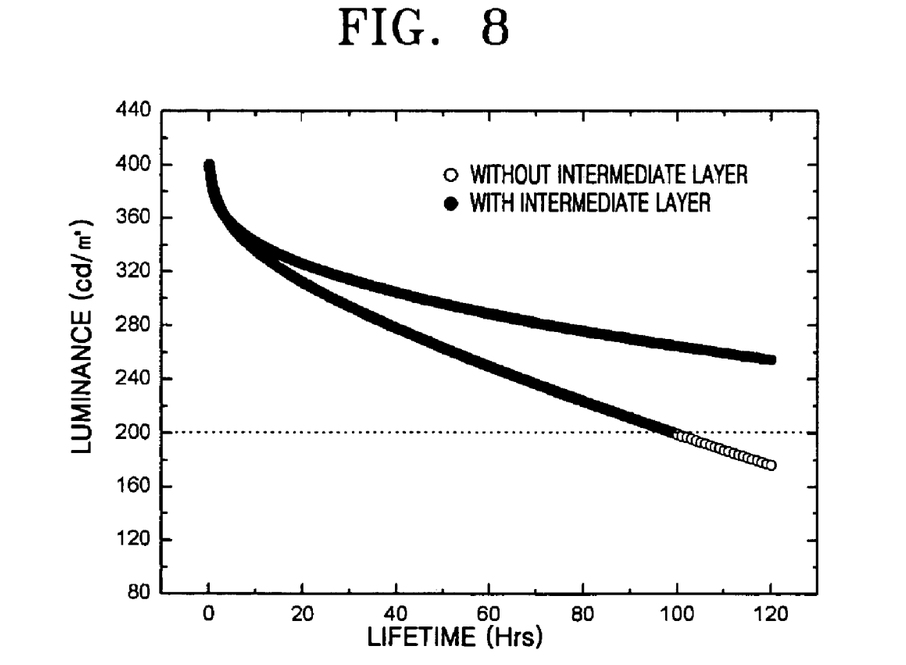
FIG. 8 illustrates a graph of the lifetime characteristics of the organic electroluminescent devices manufactured in Example 3 and Example 5.

Referring to FIGS. 7 and 8, the organic electroluminescent device produced in Example 1 exhibited higher efficiency and better lifetime characteristics than the organic electroluminescent device produced in Example 5.

As described above, a substance for an intermediate layer according to embodiments of the present invention has excellent solubility, and may be easily formed into a thin film. In addition, the formed thin film may exhibit stability in the solvent, and a variable thickness of the thin film may be easily obtained. In particular, various band gaps and LUMO/HOMO values may be easily controlled according to the characteristics of the hole transporting material used, so that an intermediate layer with desired characteristics may be formed. Therefore, the introduction of an intermediate layer manufactured using the substance for an intermediate layer according to embodiments of the present invention may result in an organic electroluminescent device having high efficiency and a long lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A layer of an organic electroluminescent device, wherein the layer comprises:

Formula 1 where A is an amine derivative moiety comprising a hole transporting capability, wherein the amine derivative moiety is selected from the group consisting of a 2-valent moiety, a 3-valent moiety, and a 4-valent moiety, each of $Y_1$, $Y_2$, $Y_3$, and $Y_4$ is independently a group comprising a functional group capable of crosslinking; and each of a and b is independently 0 or 1, wherein if A is a 2-valent moiety, both a and b are 0 and if A is a 4-valent moiety, both a and b are 1, wherein at least one of $Y_1$, $Y_2$, $Y_3$, and $Y_4$ is selected from the group consisting of Formula 3 where $R_1$ is selected from the group consisting of a substituted or unsubstituted $C_{1-12}$ linear or branched alkylene group, a substituted or unsubstituted $C_{3-12}$ cycloalkylene group, a substituted or unsubstituted $C_{6-14}$ arylene group, a substituted or unsubstituted $C_{2-14}$ hetroarylene group, —O—C(=O)—(CH$_2$)$_n$—, and —(CH$_2$)$_n$—O— where n is an integer from 1-12;

where each of $R_2$, $R_3$, and $R_4$ is independently selected from the group consisting of H, Cl, —OH, a $C_{1-12}$ alkyl group, a $C_{1-12}$ alkoxy group, a $C_{1-12}$ hydroxyalkyl group, a $C_{6-14}$ aryl group, and a $C_{2-14}$ heteroaryl group; and where $R_5$ is selected from the group consisting of H, a $C_{1-12}$ alkyl group, a $C_{1-12}$ alkoxy group, a $C_{6-14}$ aryl group, and a $C_{2-14}$ heteroaryl group.

2. The layer of claim 1, wherein A is selected from the group consisting of

Formula 2

-continued where X is selected from the group consisting of a single bond —(CH$_2$)$_n$— where n is 1 or 2, —C(R$_1$)(R$_2$)—, —CH═CH—, —S—, —O—, and —Si(R$_1$)(R$_2$)— where each of R$_1$ and R$_2$ is independently a moiety selected from the group consisting of a substituted or unsubstituted C$_{1-12}$ linear or branched alkyl group, a substituted or unsubstituted C$_{3-12}$ cycloalkyl group, a substituted or unsubstituted C$_{5-14}$ aryl group, or a substituted and unsubstituted C$_{2-14}$ heteroaryl group;

where each of Ar$_1$, Ar$_2$, Ar$_3$ and Ar$_4$ is independently a moiety selected from the group consisting of a substituted or unsubstituted C$_{1-12}$ linear or branched alkylene group, a substituted or unsubstituted C$_{3-12}$ cycloalkylene group, a substituted or unsubstituted C$_{5-14}$ arylene group, and a substituted or unsubstituted C$_{2-14}$ heteroarylene group; and where B is selected from the group consisting of a hydrogen atom, a C$_{1-12}$ linear or branched alkyl group, a C$_{3-12}$ cycloalkyl group, a substituted or unsubstituted C$_{5-14}$ aryl group, and a substituted or unsubstituted C$_{2-14}$ hetroaryl group.

3. The layer of claim 2, wherein the group represented by Formula 2 comprises:

Formula 6 where each of R, R', R", R''', and R'''' is a one-substituted or multi-substituted functional group, and is independently a moiety selected from the group consisting of a hydrogen, a substituted or unsubstituted C$_{1-12}$ linear or branched alkyl group, a substituted or unsubstituted C$_{3-12}$ cycloalkyl group, a substituted or unsubstituted C$_{5-14}$ aryl group, and a substituted or unsubstituted C$_{2-14}$ heteroaryl group.

4. The layer of claim 1, wherein the layer comprises a compound selected from the group consisting of the compounds represented by Formula 4 and Formula 5:

Formula 4

Formula 5

5. An organic electroluminescent device, comprising:
an organic layer interposed between a pair of electrodes, wherein the organic layer comprises an intermediate layer, wherein the intermediate layer comprises:

Formula 1 where A is an amine derivative moiety comprising a hole transporting capability, wherein the amine derivative moiety is selected from the group consisting of a 2-valent moiety, a 3-valent moiety, and a 4-valent moiety; each of $Y_1$, $Y_2$, $Y_3$, and $Y_4$ is independently a group comprising a functional group capable of crosslinking; and each of a and b is independently 0 or 1, wherein if A is a 2-valent moiety, both a and b are 0 and if A is a 4-valent moiety, both a and b are 1, wherein at least one of $Y_1$, $Y_2$, $Y_3$, and $Y_4$ is selected from the group consisting of

Formula 3 where $R_1$ is selected from the group consisting of a substituted or unsubstituted $C_{1-12}$ linear or branched alkylene group, a substituted or unsubstituted $C_{3-12}$ cycloalkylene group, a substituted or unsubstituted $C_{6-14}$ arylene group, a substituted or unsubstituted $C_{2-14}$ hetroarylene group, —O—C(=O)—(CH$_2$)$_n$—, and —(CH$_2$)$_n$—O— where n is an integer from 1-12;
where each of $R_2$, $R_3$, and $R_4$ is independently selected from the group consisting of H, Cl, —OH, a $C_{1-12}$ alkyl group, a $C_{1-12}$ alkoxy group, a $C_{1-12}$ hydroxyalkyl group, a $C_{6-14}$ aryl group, and a $C_{2-14}$ heteroaryl group; and
where $R_5$ is selected from the group consisting of H, a $C_{1-12}$ alkyl group, a $C_{1-12}$ alkoxy group, a $C_{6-14}$ aryl group, and a $C_{2-14}$ heteroaryl group.

6. The organic electroluminescent device of claim 5, wherein A is selected from the group consisting of Formula 2 where X is selected from the group consisting of a single bond —(CH$_2$)$_n$— where n is 1 or 2, —C(R$_1$)(R$_2$)—, —CH=CH—, —S—, —O—, and —Si(R$_1$)(R$_2$)— where each of R$_1$ and R$_2$ is independently a moiety selected from the group consisting of a substituted or unsubstituted C$_{1-12}$ linear or branched alkyl group, a substituted or unsubstituted C$_{3-12}$ cycloalkyl group, a substituted or unsubstituted C$_{5-14}$ aryl group, or a substituted and unsubstituted C$_{2-14}$ heteroaryl group;

where each of Ar$_1$, Ar$_2$, Ar$_3$ and Ar$_4$ is independently a moiety selected from the group consisting of a substituted or unsubstituted C$_{1-12}$ linear or branched alkylene group, a substituted or unsubstituted C$_{3-12}$ cycloalkylene group, a substituted or unsubstituted C$_{5-14}$ arylene group, and a substituted or unsubstituted C$_{2-14}$ heteroarylene group; and where B is selected from the group consisting of a hydrogen atom, a C$_{1-12}$ linear or branched alkyl group, a C$_{3-12}$ cycloalkyl group, a substituted or unsubstituted C$_{5-14}$ aryl group, and a substituted or unsubstituted C$_{2-14}$ hetroaryl group.

7. The organic electroluminescent device of claim 6, wherein the group represented by Formula 2 comprises:

Formula 6 where each of R, R', R", R''', and R'''' is a one-substituted or multi-substituted functional group, and is independently a moiety selected from the group consisting of a hydrogen, a substituted or unsubstituted C$_{1-12}$ linear or branched alkyl group, a substituted or unsubstituted C$_{3-12}$ cycloalkyl group, a substituted or unsubstituted C$_{5-14}$ aryl group, and a substituted or unsubstituted C$_{2-14}$ heteroaryl group.

8. The organic electroluminescent device of claim 5, wherein the layer comprises a compound selected from the group consisting of the compounds represented by Formula 4 and Formula 5:

Formula 4

Formula 5

9. The organic electroluminescent device of claim 5, wherein the organic layer comprises an intermediate layer interposed between a hole transporting layer and an electroluminescent layer.

10. The organic electroluminescent device of claim 9, wherein the organic electroluminescent device comprises a structure selected from the group consisting of an anode/hole transporting layer/intermediate layer/emissive layer/cathode structure, an anode/buffer layer/hole transporting layer/intermediate layer/emissive layer/cathode structure, an anode/buffer layer/hole transporting layer/intermediate layer/emissive layer/electron transporting layer/cathode structure, an anode/buffer layer/hole transporting layer/intermediate layer/emissive layer/hole blocking layer/cathode structure, and an anode/hole transporting layer/emissive layer/cathode structure.

11. The organic electroluminescent device of claim 10, wherein the buffer layer comprises a compound selected from the group consisting of copper phthalocyanine (CuPc), m-MTDATA, polythiophene, polyaniline, polyacetylene, polypyrrole, and a polyphenylene vinylene (PPV) derivative.

12. The organic electroluminescent device of claim 10, wherein the hole blocking layer comprises a compound selected from the group consisting of LiF, $BaF_2$, and $MgF_2$.

13. The organic electroluminescent device of claim 10, wherein the anode comprises a compound selected from the group consisting of ITO (Indium Tin Oxide), IZO (Indium Zinc Oxide), $SnO_2$, ZnO, and any combinations thereof.

* * * * *